United States Patent [19]

Kithil et al.

[11] Patent Number: 5,844,486
[45] Date of Patent: Dec. 1, 1998

[54] INTEGRAL CAPACITIVE SENSOR ARRAY

[75] Inventors: Philip W. Kithil; Michael H. Barron, both of Santa Fe, N. Mex.

[73] Assignee: Advanced Safety Concepts, Inc., Santa Fe, N. Mex.

[21] Appl. No.: 778,871

[22] Filed: Jan. 2, 1997

[51] Int. Cl.[6] .................................................. G08B 23/00
[52] U.S. Cl. ............................ 340/573; 280/735; 701/45
[58] Field of Search ........................... 340/573; 280/735; 701/45

[56] References Cited

U.S. PATENT DOCUMENTS

| | | | |
|---|---|---|---|
| 3,740,567 | 6/1973 | Atkins | 307/10 SB |
| 3,863,209 | 1/1975 | Hollins | 340/52 E |
| 4,625,329 | 11/1986 | Ishikawa et al. . | |
| 4,700,973 | 10/1987 | Gademann et al. | 280/735 |
| 4,796,013 | 1/1989 | Yasuda et al. | 340/562 |
| 4,885,566 | 12/1989 | Aoki | 340/457.1 |
| 4,972,154 | 11/1990 | Bechtel | 324/663 |
| 5,002,308 | 3/1991 | Lenzen et al. | 280/735 |
| 5,074,583 | 12/1991 | Fujita et al. | 280/735 |
| 5,166,679 | 11/1992 | Vranish et al. | 340/870.37 |
| 5,281,921 | 1/1994 | Novak | 324/671 |
| 5,330,226 | 7/1994 | Gentry et al. . | |
| 5,366,241 | 11/1994 | Kithil | 280/735 |
| 5,394,097 | 2/1995 | Bechtel et al. | 324/687 |
| 5,398,185 | 3/1995 | Omura . | |
| 5,400,487 | 3/1995 | Gioutsos et al. | 280/735 |
| 5,431,438 | 7/1995 | Manabe | 280/731 |
| 5,439,249 | 8/1995 | Steffens, Jr. et al. | 280/735 |
| 5,446,661 | 8/1995 | Gioutsos et al. | 364/424.05 |
| 5,482,314 | 1/1996 | Corrado et al. | 280/735 |
| 5,494,311 | 2/1996 | Blackburn et al. | 280/735 |
| 5,525,843 | 6/1996 | Howing | 307/9.1 |
| 5,602,734 | 2/1997 | Kithil | 345/669 |

FOREIGN PATENT DOCUMENTS

| | | |
|---|---|---|
| 4023109A1 | 7/1990 | Germany . |
| WO 92/08947 | 5/1992 | WIPO ......................... 7/34 |

OTHER PUBLICATIONS

Baxter, L.K., "Capacitive Sensors —Design and Applications," *IEEE Press Series on Electronics Technology*, pp. 22–23, 45, 69, 71, and 74 (1997).

Novak, J.L., "A Capacitance–Based Proximity Sensor for Whole Arm Obstacle Avoidance," *Proc. 1992 IEEE Int'l Conf on Robotics and Automation*, pp. 1307–1314 (May 1992).

*Primary Examiner*—Edward Lefkowitz
*Attorney, Agent, or Firm*—Jeffrey D. Myers

[57] ABSTRACT

A capacitive sensor array wherein the plurality of electrodes and the power and data lines communicating with the electrodes are formed from a single dielectric substrate. One face of the substrate is a grounded area, with the electrodes and power and data lines formed from the substrate on the opposite face. A ground connector connects the grounded areas on the two faces without a need to penetrate the substrate. The substrate is flexible, and the power and data lines are die cut from a portion of the substrate to form an integrated cable.

17 Claims, 2 Drawing Sheets

INTEGRAL CAPACITIVE SENSOR ARRAY

CROSS-REFERENCE TO RELATED APPLICATIONS

Related applications are pending, namely patent application Ser. No. 08/311,576, entitled "Automobile Air Bag System", filed on Sep. 23, 1994, now U.S. Pat. No. 5,602,734 patent application Ser. No. 08/535,576, entitled "Impaired Transportation Vehicle Operator System", filed on Sep. 28, 1995, and patent application Ser. No. 08/621,465, entitled "Motor Vehicle Occupant Sensing Systems", filed on Mar. 25, 1996, and the specifications thereof are incorporated herein by reference.

This application claims the benefit of the filing of the following Provisional Applications: Ser. No. 60/028,358, entitled "Low Cost Capacitive Sensor Array", filed on Oct. 11, 1996; Ser. No. 60/024,027, entitled "Capacitive Zoning System for Adult and Child Discrimination in a Vehicle", filed on Aug. 16, 1996; Ser. No. 60/022,774, entitled "Safety System Enabling, Adjusting, Disabling or Actuating Sensor and Snooze Alarm", filed on Jul. 30, 1996; Ser. No. 60/017,440, entitled "Head Position Detection and Recording System", filed on May 17, 1996; Ser. No. 60/016,374, entitled "Occupant Detecting System", filed on Apr. 23, 1996; and Ser. No. 60/032,265, entitled "Noncontacting Switch Responsive to Human Body Proximity or Motion", filed on Dec. 3, 1996.

BACKGROUND OF THE INVENTION

1. Field of the Invention (Technical Field)

The present invention relates to capacitive sensor arrays for sensing presence and location of persons, particularly within an automotive vehicle.

2. Background Art

Capacitive sensor arrays are employed in the art for detection of persons, including for presence and position within automobiles. Representative of the state of the art is U.S. Pat. No. 5,366,241, to Kithil, in which sensor arrays are used to enhance passenger safety by providing information on occupant position and motion to alter air bag deployment characteristics. Further representative of the art are U.S. Pat. No. 3,864,668, entitled "Seat Belt Warning and Ignition Interlock System", to Bickford; U.S. Pat. No. 3,898,472, entitled "Occupancy Detector Apparatus for Automotive Safety System", to Long; U.S. Pat. No. 4,796,013, entitled "Capacitive Occupancy Detector Apparatus", to Yasuda et al.; and U.S. Pat. No. 4,887,024, entitled "Person Detecting Device", to Sugiyama et al. U.S. Pat. Nos. 4,972,154 and 5,394,097, entitled "Apparatus and Method for Measuring Wood Grain Angle" and "Dielectric Sensor", respectively, to Bechtel, et al., exemplify one and two-sided fabrication of electrodes on traditional printed circuit (PC) boards.

Existing systems, which are built from multiple discrete components or traditional PC board design principles, are difficult and expensive to manufacture, and suffer from lack of uniformity between devices. Existing capacitive sensing systems for occupancy detection rely upon capacitive sensors formed from discrete electrodes, which may experience changes in capacitance caused by sources other than occupant presence and position. In occupant safety systems such as automotive air bags, these stray signals create uncertainty as to whether the sensor output reflects a change in condition of occupancy, occupant position, or if the capacitive change is attributable to other sources. Therefore, existing capacitive systems have been deemed unreliable for safety-critical applications. The present invention substantially corrects these defects in the prior art.

SUMMARY OF THE INVENTION (DISCLOSURE OF THE INVENTION)

The present invention is of a capacitive sensor array comprising: a plurality of electrodes comprising at least one drive electrode and at least one receive electrode, the electrodes formed only on a first face of a single dielectric substrate; power and data lines to and from the electrodes, the lines formed only on the first face of the single dielectric substrate; and a monolithic grounded area formed on a second face of the single dielectric substrate. In the preferred embodiment, the array additionally comprises electronic components, all of which are placed only on the first face of the single dielectric substrate. A connector connects grounded areas on the first face to the monolithic grounded area, without penetrating the single dielectric substrate. The substrate is preferably flexible, and a portion of the power and data lines is die cut to form an integrated cable. The array is preferably disposable proximate a vehicle occupant seating position to permit sensing of the occupant, most preferably in a vehicle roof above the occupant seating position, and is capable of being used in performance of one or more of the following actions: modify air bag performance; adjust seat positioning; adjust seat headrest positioning; detect driver impairment; adjust mirrors; detect a possibly unauthorized vehicle operator; detect and record head position and motion; adjust vehicle heating/cooling; adjust sound balance; and adjust other interior convenience systems.

The invention is additional of a capacitive sensor array comprising: a plurality of electrodes comprising at least one drive electrode and at least one receive electrode, the electrodes formed on a flexible dielectric substrate; and power and data lines to and from the electrodes, the lines formed on the dielectric substrate; wherein a portion of the flexible dielectric substrate comprising a portion of the power and data lines is die cut to form an integrated cable. In the preferred embodiment, the electrodes are formed only on a first face of the flexible dielectric substrate, and preferably the power and data lines are as well. A monolithic grounded area is formed on a second face of the flexible dielectric substrate. A connector connects grounded areas on the first face to the monolithic grounded area, wherein the connector does not penetrate the flexible dielectric substrate. Electronic components are placed only on the first face of the flexible dielectric substrate. The array is preferably disposable proximate a vehicle occupant seating position to permit sensing of the occupant, most preferably in a vehicle roof above the occupant seating position, and is capable of being used in performance of one or more of the following actions: modify air bag performance; adjust seat positioning; adjust seat headrest positioning; detect driver impairment; adjust mirrors; detect a possibly unauthorized vehicle operator; detect and record head position and motion; adjust vehicle heating/cooling; adjust sound balance; and adjust other interior convenience systems.

A primary object of the present invention is to provide a capacitive sensor array which is formed from a single dielectric substrate.

An additional object of the invention is to position the electrodes, common grounded areas, connecting cable(s), and electronic parts in such a manner as to reduce production costs of the sensor while improving sensor output reliability, and enhancing manufacturing uniformity.

Primary advantages of the present invention are ease of manufacturing, reliability of the resulting device, and uniformity between devices.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

Figure 1:
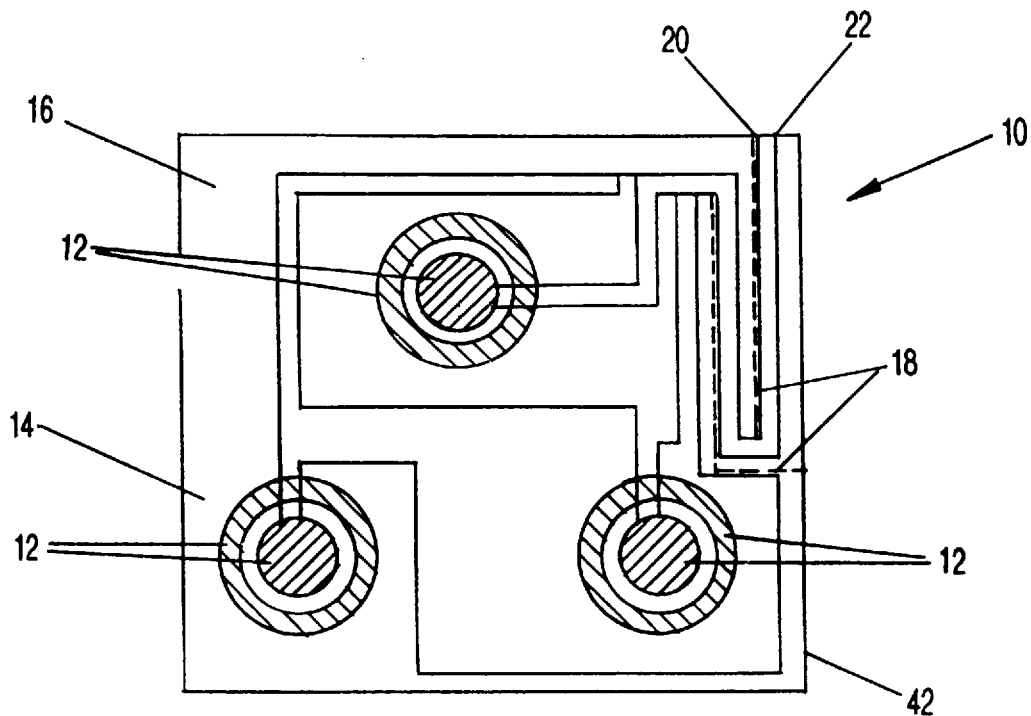
FIG. 1 is a top view of a capacitive sensor array according to the invention.

DESCRIPTION OF THE PREFERRED EMBODIMENTS (BEST MODES FOR CARRYING OUT THE INVENTION)

The present invention is of a capacitive sensor, or array of sensors, comprising: fabrication on a single dielectric substrate (preferably a flexible PC board) of all the sensors of the array; utilization of a double-sided substrate rather than a typical four-layer PC board construction; simplification of the electronic parts assembly to and within the PC board; an interconnect cable integral with the sensor array; and a means of providing common ground to both sides of the substrate.

Of the capacitance sensors known for occupant sensing applications, five variations are found in the art, all of which respond to the interference of the electric fields caused by the presence of a person. The capacitance sensor may consist of: (1) dual opposing electrodes with electric fields therebetween; (2) one electrode which capacitively couples to the metal skin of the vehicle; (3) one electrode which capacitively couples to the person who is grounded to the vehicle; (4) parallel electrodes which are spatially separated in either a planar or nonplanar fashion; or, as in applicant's present and pending applications, (5) the sensor may consist of dual adjacent planar electrodes in which one electrode is driven by an oscillator and the adjacent electrode capacitively couples to the driven electrode, to create a sensing field. The present invention can accomplish these variations with improved ease of manufacture, improved reliability, and less variability between devices produced.

Referring to the figures, in sensor array 10 (an exemplary sensor array, which may comprise one or more sensors), each of the three sensors 12 consists of an inner drive electrode 36 which is connected to an oscillator by oscillator input 28, a grounded gap 34, and an outer receive electrode 32 to which are connected electronic components for signal detection and amplification 24. The entire array, including a die-cut integrated cable 18 with signal out 22 and power, ground, and oscillator in 20, is fabricated from a single dielectric substrate 14. While the design works equally well with the drive and receive electrode in reversed position, the preferred configuration enables all the components to be installed on one side of the PC board 42 (or other dielectric substrate) without any through holes, which add expense and reduce reliability.

Figure 2:
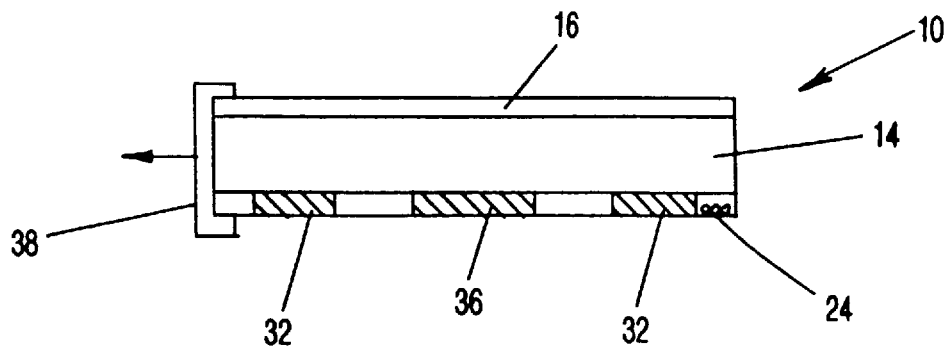
FIG. 2 is a cross-sectional view of a sensor within the array of FIG. 1.

FIG. 2 depicts the use according to the present invention of a single layer of dielectric substrate 14 with a grounded area 16 throughout the reverse side, and the drive and receive electrodes 36 and 32, and electronic components 24, on the obverse, detector side. The ground plane 16 on the reverse of the detector is preferably connected to the grounded areas 16 and 34 on the detector side with a crimped connector 38 which encompasses the PC board edge. This also eliminates the need for PC board through-holes, thus reducing cost and improving reliability.

Figure 3:
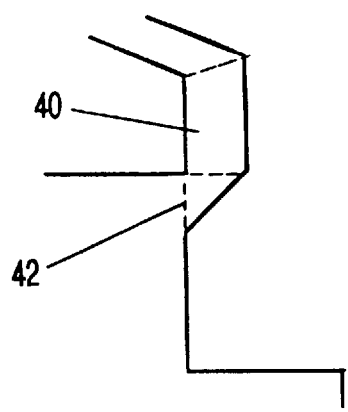
FIG. 3 illustrates a partial view of a folded-out connecting cable die cut from the array of FIG. 1.

In FIG. 3, a portion of the integrated interconnect cable 40 is shown, which is formed from the pre-die-cut cable 18 during manufacturing. The view corresponds to the upper right corner of FIG. 1, which shows an array 10 before the die-cutting operation to free the pre-die-cut cable 18 to fold away from the PC board 42.

Figure 4:
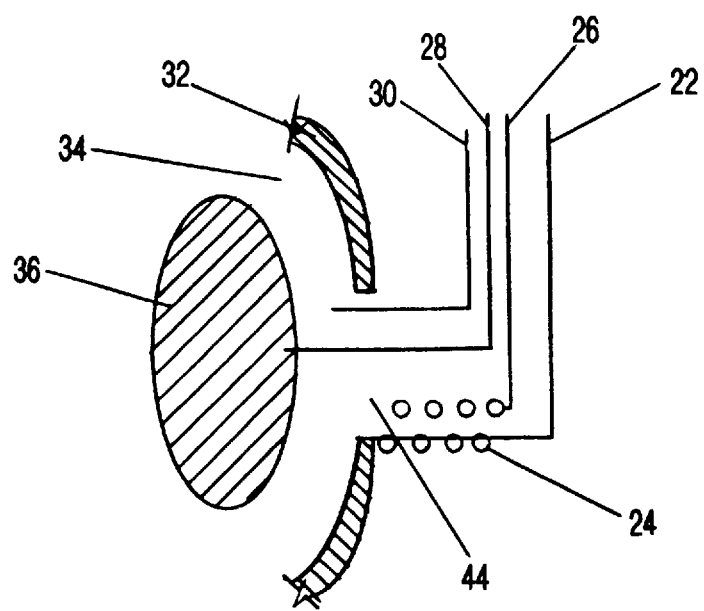
FIG. 4 is a schematic diagram of electrical connections and component placement according to the invention.

FIG. 4 illustrates how the oscillator input circuit 28 is fed to the inner drive electrode 36. This is achieved by forming a slotted opening 44 in the outer receive electrode 32 for the input circuit 28 to pass through. The opening for the circuit further provides space for installation of electronic components 24 on the detector side, including power 26 and signal output 22, very close to the receive electrode, to maximize sensitivity while minimizing cost. Grounding is effected through the opening as well, with ground 30 accessing grounded gap 34 therethrough.

The present invention utilizes electrodes which are proximate and planar, and preferably encompassed by common grounded areas front and back. The grounding scheme isolates the plates from outside interference and from each other, reducing stray capacitive coupling, and improving reliability for accurate detection of occupant presence and position. The grounded region between the plates shunts very near-field coupling to ground, allowing the much weaker signals at far range to be discernable.

By positioning both electrodes on the same side of a dielectric substrate, and placing the electronic parts adjacent to the receive electrode, stray capacitance is further reduced, and capacitive changes attributable to substrate expansion or contraction at extreme temperatures is virtually eliminated. Sensor resistance to influence from electromagnetic (EMI) sources is also reduced as a result of this construction. In an automotive occupant sensing system in which the sensor(s) are placed on the head liner above an occupant seating position, the electrodes and electronic parts are on the side facing down, thereby using the substrate and the opposite-side ground plane to further insulate these elements from extreme temperatures, EMI, and the like.

In the present sensor construction, which employs a single layer of dielectric substrate, the elimination of mid-layer circuitry that is found in double-substrate sensor construction further reduces the stray capacitance which can create ambiguity in sensor output. Reliability of the single-substrate design is further enhanced by eliminating any plated through-holes, which are required in double-substrate designs to carry signals and ground from one side to the other. The ground plane is connected to the grounded gap between the electrodes, either by a crimped connector, or by double folding the flexible substrate so that one side contacts the other.

Using the example of the sensor installed in the roof of a vehicle, the ground plane on the top side of the sensor electrically isolates the electrodes on the bottom side, which then become sensitive to conductive objects such as a human body or head positioned in the region below the roof, but insensitive to such objects above the roof. Thus, a sensing zone is created which fills the volume below the roof over an occupant seating position, but does not extend laterally or above the roof. Furthermore, a round electrode geometry provides for generally hemispheric electric field lines, which are uniformly affected by the presence and proximity of the occupant, regardless of the angular position of the occupant relative to the face of the sensor.

Another application of the sensor of the invention is to switch the output of a steering-wheel-mounted air bag system according to the proximity of the vehicle occupant's body relative to the air bag door. The sensor, located in the path of an expanding airbag, preferably employs a perforated tear line or tear lines, such as across the sensor's midpoint. The tearline permits egress of the air bag from the system on activation. Electronic parts are preferably located on the side of the sensor facing the driver but away from the tearline or tearlines. This is so that the rapid airbag deployment will not detach electronic parts and propel them into the occupant. It is convenient in this embodiment to connect the monolithic grounded area on the back of the sensor with the grounded areas on the front via a connection through one or more of the perforations provided by the tearline.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above, and of the corresponding applications, are hereby incorporated by reference.

What is claimed is:

1. A capacitive sensor array comprising:

a plurality of detectors comprising at least one drive electrode and at least one receive electrode, said electrodes formed only on a first face of a single dielectric substrate;

means for communicating power and data with said electrodes, said means for communicating formed only on said first face of said single dielectric substrate; and a monolithic grounded area formed on a second face of said single dielectric substrate.

2. The array of claim 1 additionally comprising electronic components, all of which are placed only on said first face of said single dielectric substrate.

3. The array of claim 1 additionally comprising means for connecting grounded areas on said first face to said monolithic grounded area, wherein said connecting means does not penetrate said single dielectric substrate.

4. The array of claim 1 wherein said single dielectric substrate is flexible.

5. The array of claim 4 wherein a portion of said flexible dielectric substrate comprising a portion of said means for communicating power and data is die cut to form an integrated cable.

6. The array of claim 1 wherein said sensor array is deployable to provide data to a controller directing an action selected from the group consisting of: modify air bag performance; adjust seat positioning; adjust seat headrest positioning; detect driver impairment; adjust mirrors; detect a possibly unauthorized vehicle operator; detect and record head position and motion; adjust vehicle heating/cooling; adjust sound balance; and adjust other interior convenience systems.

7. The array of claim 1 additionally comprising a sequence of perforations through said dielectric substrate, said perforations permitting the array to part along the perforations when exposed to an expanding automobile airbag.

8. The array of claim 7 additionally comprising means for connecting grounded areas on said first face to said monolithic grounded area, wherein said connecting means passes through one or more of said perforations.

9. A capacitive sensor array comprising:

a plurality of detectors comprising at least one drive electrode and at least one receive electrode, said electrodes formed on a flexible dielectric substrate; and means for communicating power and data with said electrodes, said means for communicating formed on said dielectric substrate;

wherein a portion of said flexible dielectric substrate comprising a portion of said means for communicating power and data is die cut to form an integrated cable.

10. The array of claim 9 wherein said electrodes are formed only on a first face of said flexible dielectric substrate.

11. The array of claim 10 wherein said means for communicating are formed only on said first face of said flexible dielectric substrate.

12. The array of claim 10 additionally comprising a monolithic grounded area formed on a second face of said flexible dielectric substrate.

13. The array of claim 12 additionally comprising means for connecting grounded areas on said first face to said monolithic grounded area, wherein said connecting means does not penetrate said flexible dielectric substrate.

14. The array of claim 10 additionally comprising electronic components, all of which are placed only on said first face of said flexible dielectric substrate.

15. The array of claim 9 wherein said sensor array is deployable to provide data to a controller directing an action selected from the group consisting of: modify air bag performance; adjust seat positioning; adjust seat headrest positioning; detect driver impairment; adjust mirrors; detect a possibly unauthorized vehicle operator; detect and record head position and motion; adjust vehicle heating/cooling; adjust sound balance; and adjust other interior convenience systems.

16. The array of claim 9 additionally comprising a sequence of perforations through said dielectric substrate, said perforations permitting the array to part along the perforations when exposed to an expanding automobile airbag.

17. The array of claim 16 additionally comprising means for connecting grounded areas on said first face to said monolithic grounded area, wherein said connecting means passes through one or more of said perforations.

* * * * *